United States Patent [19]

Nguyen et al.

[11] Patent Number: 5,463,250
[45] Date of Patent: Oct. 31, 1995

[54] SEMICONDUCTOR COMPONENT PACKAGE

[75] Inventors: Ngon B. Nguyen, Jessup, Md.;
Franklin B. Jones, Shrewsbury, Mass.

[73] Assignee: Westinghouse Electric Corp., Pittsburgh, Pa.

[21] Appl. No.: 235,055

[22] Filed: Apr. 29, 1994

[51] Int. Cl.⁶ .......................... H01L 23/02; H01L 23/12
[52] U.S. Cl. .......................... 257/698; 257/705; 257/707; 257/692
[58] Field of Search .................. 257/698, 699, 257/700, 704, 664, 705, 691, 707, 692

[56] References Cited

U.S. PATENT DOCUMENTS 3,663,868  5/1972  Noguchi et al. .................. 257/704
4,922,324  5/1990  Sudo .................. 257/698

*Primary Examiner*—Sara W. Crane
*Assistant Examiner*—S. V. Clark
*Attorney, Agent, or Firm*—Walter G. Sutcliff

[57] ABSTRACT

A package for power semiconductor components permitting high thermal dissipation and current conductance and including a frame assembly bonded to a substrate on which a power semiconductor chip is mounted. The frame assembly has a wirebonding grid for connecting short, uniform length wirebonds to the surface of the chip. The grid is configured so as to have a portion overlaying and spaced from the chip a distance less than a distance required to connect a wirebond of optimal length to each anode cell of the chip. The package allows a high power semiconductor device to be used as a surface mount device or as a hockey puck.

13 Claims, 3 Drawing Sheets

SEMICONDUCTOR COMPONENT PACKAGE

BACKGROUND OF THE INVENTION

1. Field of the Invention

The present invention relates to a semiconductor component; and more particularly, to a package for power semiconductor circuit components. Although the present invention is suitable to many high power components, it is especially suited for use with a substrate MOS Controlled Thyristor (MCT); and will be particularly described in that connection.

2. Description of Related Art

Designers of today's electronic circuitry and power supplies strive for miniaturization. As higher power density is demanded, advanced components and packaging capabilities must be produced. Recently developed materials and components, such as the substrate MOS Controlled Thyristor (MCT), MCT, and insulated gate drive bipolar transistor (IGBT), significantly contribute to the increase in power density.

A power component package must enable high thermal dissipation and high current conductance from a very small surface area. An ultra high power semiconductor device such as a substrate MCT has recently been developed such that a small chip (0.750"×0.750") can conduct a 2000 ampere current and a power density of 550 watt/cm$^2$. It's application can simplify many power conversion circuit designs. For example, this chip can replace a large number of field-effect transistors (FETs) connected in parallel and series and used as a high power switch. An FET is a semiconductor device whose operation depends on the use of an applied electric field to control device current. Metal oxide semiconductor FETs (MOSFETs) are often arranged in parallel and series in integrated circuits as switches.

A chip such as the substrate MCT requires a package capable of removing high levels of current density and thermal density. A package design has been proposed that utilizes large gauge aluminum wirebonds (0.01 inches or 0.02 inches in diameter) to connect in parallel anode cells on the chip surface to a surrounding copper surface. The chip is mounted on an electrically isolated second copper surface that acts as the cathode.

Because the aluminum wirebonds extend from various points on the chip to the surrounding copper surface, the wirebond lengths vary. This large length variation in parallel wirebonds causes a greater proportion of the current from the chip to conduct through the Short wirebonds. This brings about a domino effect failure, starting with the short wirebonds burning open.

In addition, the length of longer wirebonds may exceed its mechanical reliability limit. As the size of the MCT is approximately 0.750"×0.750", the wirebonds connecting the middle anode cells to the copper surface are at least 0.375 inches long. The mechanical reliability limit of the wirebond is a maximum of 0.200 inches.

Longer wires also cause greater voltage drops along the wire. As the resistance of a wire depends on its length, the longer wires will be more resistant. Due to Ohm's Law, the voltage drop along such wires is greater.

Conductance of the current from the MCT chip requires a large number of wirebonds. For example, the current rating of a 0.02 inch diameter aluminum wirebond is 20 amperes. For a high current application of 2000 amperes, at least 100 such wirebonds must be used. The area surrounding a typical chip may be insufficient to bond the required number of wirebonds.

In light of the foregoing, there is a need for a package for a power semiconductor device that utilizes shorter uniform length wirebonds, has sufficiently large wirebonding area, and enables high thermal dissipation and high current conductance with minimal resistance.

SUMMARY OF THE INVENTION

Accordingly, the present invention is directed to a package for a semiconductor device that substantially obviates problems due to the limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus particularly pointed out in the written description and claims hereof as well as the appended drawings.

To achieve these and other advantages and in accordance with the purpose of the invention, as embodied and broadly described, there is provided a semiconductor package, comprising a substrate having a ceramic core with first and second opposite planar surfaces, a copper foil layer bonded to the second planar surface, a copper inner mounting pad on the first planar surface, a copper outer ring on the first planar surface surrounding and electrically isolated from the inner mounting pad, and a plurality of spaced copper vias extending through the ceramic core electrically connecting the mounting pad to the copper foil layer; and a metallic frame assembly having a central chamber formed by sidewalls of a predetermined height mounted on the outer ring of the first planar surface of the substrate, a pair of terminals extending through the sidewalls of the chamber, and a wirebonding grid spanning the central chamber and having an electrical isolation layer bonded to a surface of the wirebonding grid opposing and spaced from the substrate, the wirebonding grid for connecting a plurality of metallic wirebonds to each electrode of a plurality of electrode components of a chip mounted in the space between the electrical isolation layer and the inner mounting pad, the grid configured to have a portion overlaying and spaced from each electrode a distance less than a distance required to connect a plurality of wirebonds of optimal equal length to each such electrode.

In another aspect, the above semiconductor package includes a substrate MOS Controlled Thyristor (MCT) chip having a plurality of anode cells mounted on the inner mounting pad of the substrate; and a plurality of metallic wirebonds of approximately equal length electrically connecting the plurality of anode cells of the MCT to the wirebonding grid.

In a further aspect, the above semiconductor package includes a metallic cover bonded to the sidewalls of the central chamber for hermetically sealing the chamber.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate preferred embodiments of the invention, and, together with the description, serve to explain the principles of the invention.

DESCRIPTION OF THE PREFERRED EMBODIMENTS

Figure 1:
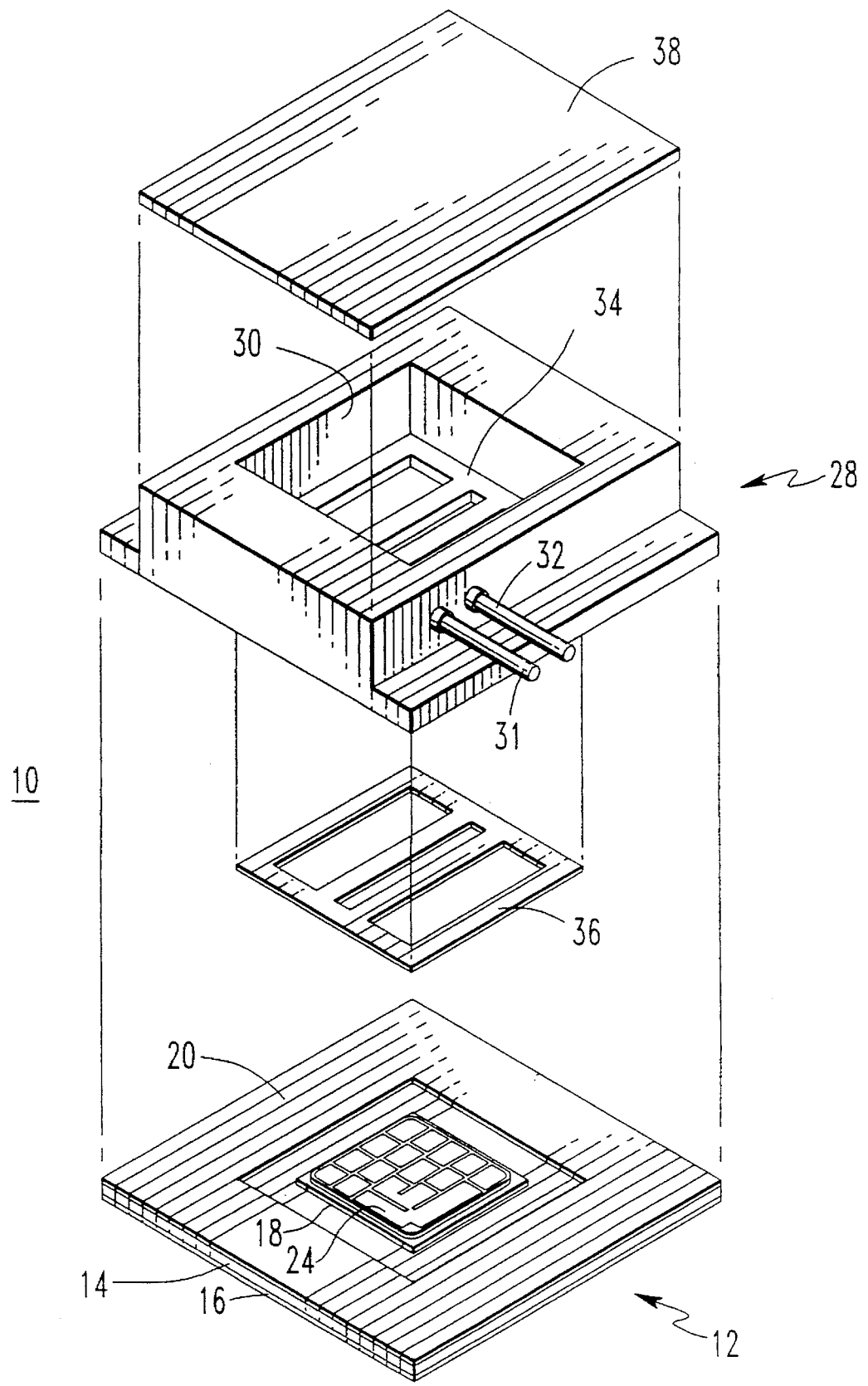
FIG. 1 is an exploded perspective view of the various portions of a semiconductor package incorporating the teachings of the present invention.

Reference will be made in detail to the present preferred embodiment of the invention, examples of which are illustrated in the accompanying drawings. Like reference numerals refer to the like parts in the various Figures of the drawings.

In accordance with the invention, a power semiconductor package is provided comprising a substrate having a ceramic core with first and second opposite planar surfaces, a copper foil layer bonded to the second planar surface, a copper inner mounting pad on the first planar surface, a copper outer ring on the first planar surface surrounding and electrically isolated from the inner mounting pad, and a plurality of spaced copper vias extended through the ceramic core electrically connecting the mounting pad to the copper foil layer.

As embodied herein and referring to FIG. 1, a semiconductor package 10 includes a substrate 12. The substrate 12 contains a ceramic core 14 which is preferably approximately 0.04 inches thick, an easily available industry-wide thickness. In addition, such a thickness provides sufficient mechanical strength without being too difficult to manufacture via holes throughout. Preferably, ceramic core 14 is composed of either aluminum nitride or beryllium oxide, both of which have high thermal conductivity.

A copper foil layer 16 is bonded to one surface of ceramic core 14 forming a cathode plate. A second layer of copper foil is etched on the surface of substrate 12 opposite copper foil layer 16 to form both an inner mounting pad 18 and an outer ring 20 surrounding and electrically isolated from mounting pad 18. Copper is used for both layers due to its high thermal and electrical conductivity.

Inner mounting pad 18 is the surface on which a power semiconductor chip is to be mounted. In order to solder mount a chip onto mounting pad 18, the coefficient of thermal expansion of both the chip material and the copper should be comparable. Preferably, direct copper bonding is used to bond copper foil layer 16, mounting pad 18 and outer ring 20 to eliminate a thermal barrier between the copper layers and ceramic core 14. Such bonding limits the thermal expansion of the copper to the substrate material's thermal expansion, which is comparable to that of a silicon semiconductor chip.

The copper mounting pad 18, which is for solder mounting a semiconductor chip, is approximately 0.80"×0.80". The copper layers preferably have a thickness of approximately 0.01 inches, an easily available industry-wide thickness. Such a thickness is preferred for conducting high current. Thinner layers may be insufficient.

Figure 2:
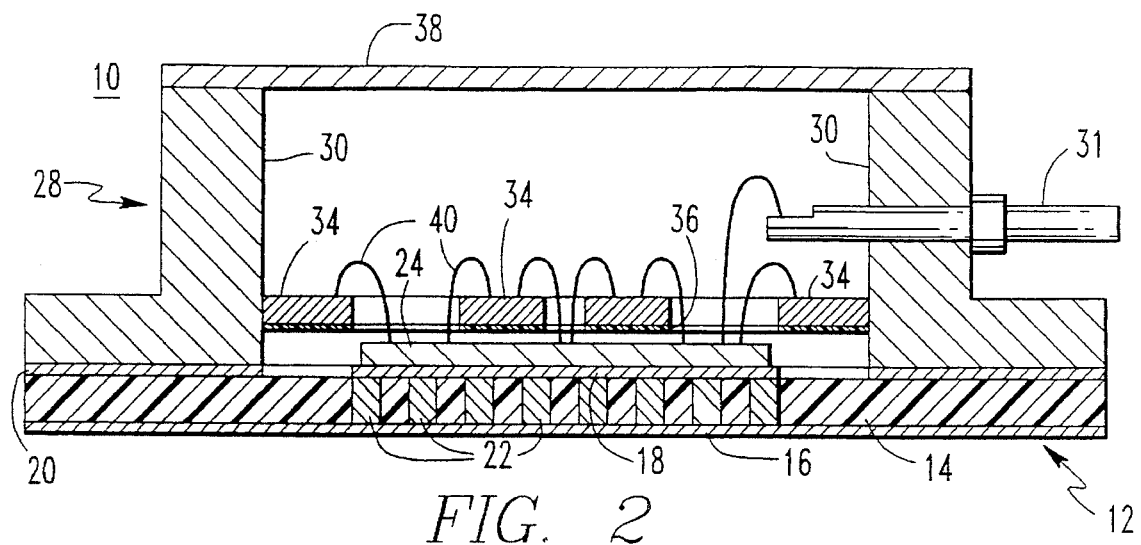
FIG. 2 is a cross-sectional view of a semiconductor package incorporating the teachings of the present invention.
Figure 3:
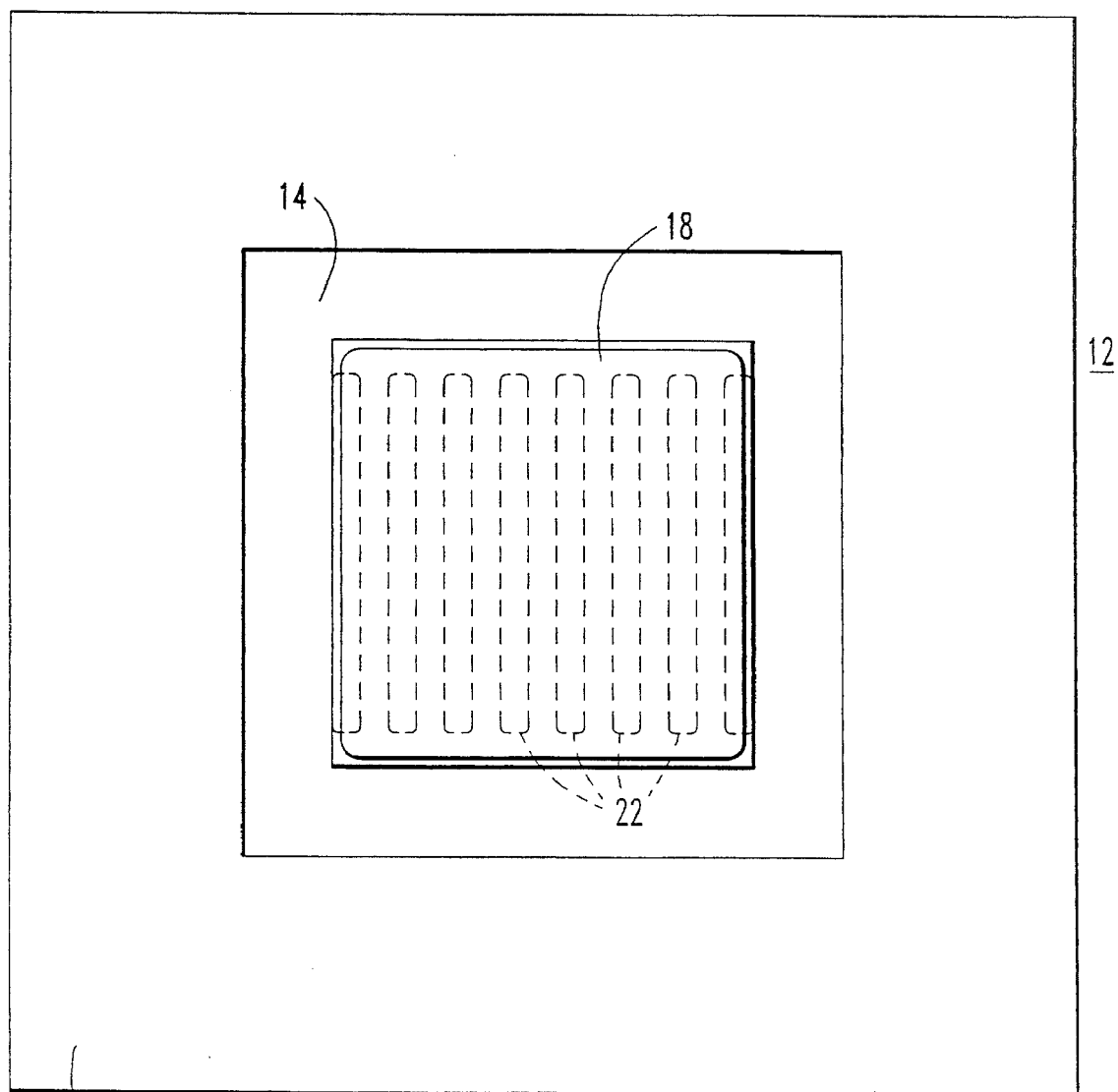
FIG. 3 is a plan view of the substrate of the semiconductor package in FIG. 2.

In accordance with the invention, the ceramic core 14 has a plurality of spaced copper vias. As embodied herein and referring to FIGS. 2–3, the ceramic core 14 has a plurality of spaced, parallel extending copper vias 22 which electrically connect inner mounting pad 18 to the copper foil layer 16. To restrict thermal expansion, copper vias 22 are preferred over a solid block of copper within the ceramic core 14. Because copper and ceramic coefficients of thermal expansion differ, the ceramic surrounding vias 22 restrict their thermal expansion. The copper vias 22 must be designed to carry sufficient current while also restricting thermal expansion. Manufacturing capabilities of ceramic core 14 will also affect the size and shape of copper vias 22.

In accordance with the present invention, the semiconductor package further comprises a metallic frame assembly having a central chamber formed by sidewalls of a predetermined height mounted on the outer ring of the first planar surface of said substrate, a pair of terminals extending through the sidewalls of the chamber, and a wirebonding grid having a portion spanning the central chamber and having an electrical isolation layer bonded to a surface of the wirebonding grid opposing and spaced from the substrate.

As embodied herein and referring to FIG. 1, the semiconductor package 10 further includes a metallic frame assembly 28, preferably composed of copper or a copper alloy with high copper content, for example, 80% copper. Frame assembly 28 is mounted on outer ring 20 of substrate 12.

Frame assembly 28 contains sidewalls 30 of a predetermined height forming a central chamber. A pair of terminals 31 and 32 extend through the sidewalls 30 and connect to an outside gate drive circuit. Terminal 31 acts as a gate drive pin and connects to a gate electrode of a semiconductor chip. Terminal 32 acts as a return of this gate drive and connects to an anode cell of a chip. Preferably, the terminals are composed of ceramic sealed copper.

Frame assembly 28 further contains a wirebonding grid 34 spanning the central chamber and, preferably, spaced approximately 0.05 inches from substrate 12, allowing room for a semiconductor chip to be mounted. An electrical isolation layer 36 is bonded to the surface of wirebonding grid 34 opposing and spaced from mounting pad 18 of substrate 12. Layer 36 insures high voltage isolation of the wirebonding grid 34 connected to anode cells 26 and the cathode of semiconductor chip 24. Preferably, either aluminum oxide or epoxy constitute electrical isolation layer 36.

The package of the present invention further includes a metallic cover bonded to the sidewalls of the central chamber for hermetically sealing the chamber.

Referring to FIG. 1, the semiconductor package 10, as embodied herein, includes a metallic cover 38 bonded to the top of sidewalls 30 of frame assembly 28. The cover 38 hermetically seals the package 10. Preferably, cover 38 is composed of copper in case there is the need for an electrical connection to cover 38. Exposed copper on cover 38, as well as other portions of package 10, including frame assembly 28 and substrate 12, is preferably chrome, nickel, or gold plated. Such plating will protect copper from oxidation and allow aluminum wirebonding.

The preferred technique to bond cover 38 to frame assembly 28 is electrical welding. As opposed to soldering or a similar process, electrical welding does not use solder or other materials. Thus, the possibility of any such material dropping onto the surface of chip 24 is removed. In addition, the voltage drop across solder joints is eliminated.

The semiconductor package of the present invention further includes a power semiconductor chip.

As embodied herein and referring to FIG. 1, package 10 includes a power semiconductor chip 24. Preferably, chip 24 is a substrate MOS Controlled Thyristor (MCT) having a size of approximately 0.750"×0.750".

Figure 4:
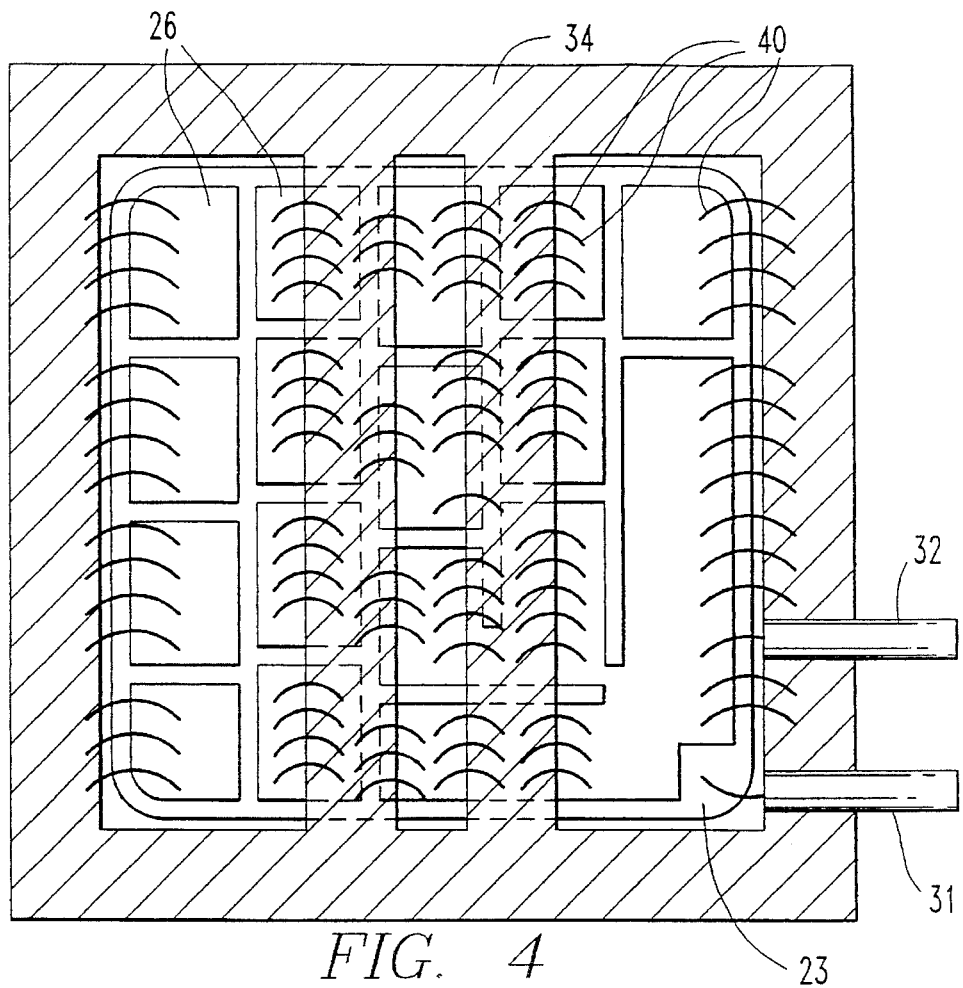
FIG. 4 is a plan view of a wirebonding grid and semiconductor chip of a semiconductor package incorporating the teachings of the present invention.
Figure 5:
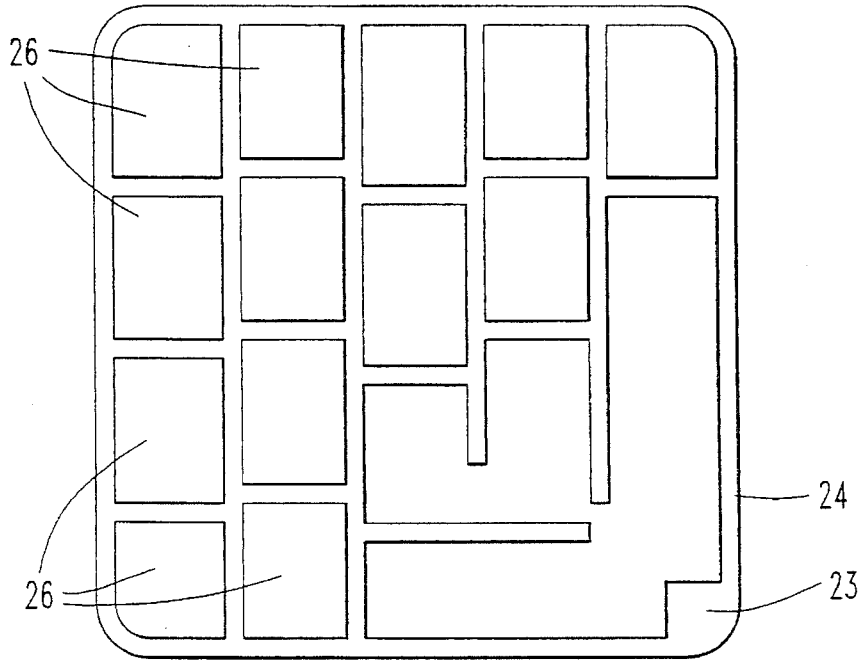
FIG. 5 is a plan view of a thyristor.

Chip 24 is mounted on inner mounting pad 18. Eutectically mounting chip 24 by a voidless soldering process with a solder preform is preferred. Such a process provides a solid, continuous connection between chip 24 and inner mounting pad 18 and results in a strong bond and favorable heat dissipation and current conductance properties. The surface bonded to mounting pad 18 is connected to copper foil layer 16 (cathode plate) through mounting pad 18 and vias 22. Referring to FIG. 4, chip 24 has a gate electrode 23 connected to terminal 31o A plurality of spaced anode cells 26 are on the chip surface opposite the surface soldered to inner mounting pad 18. Each individual cell 26 is electrically connected to a multitude of MCTs connected in parallel within chip 24. An example of such an MCT is illustrated in FIG. 5. In addition, anode cells 26 are connected in parallel to conduct high current.

In accordance with the present invention, the package further includes a plurality of metallic wirebonds of approximately equal length connecting the semiconductor chip to the wirebonding grid. As herein embodied and referring to FIG. 4, package 10 includes wirebonds 40 electrically connecting anode cells 26 of chip 24 to wirebonding grid 34. Wirebonds 40 are preferably aluminum having equal diameters in the range of approximately 0.01 to 0.02 inches. Such diameter wirebonds have the ability to carry high current.

The wirebonding grid of the present invention is configured so that short wirebonds of equal length can connect each anode cell of the semiconductor chip to the wirebonding grid. This is accomplished by forming the grid so that a portion of it overlays and is spaced from the chip a distance less than a distance required to connect a wirebond of optimal length to each anode cell.

Referring to FIG. 4, some of the anode cells 26 are arranged around the periphery of chip 24, while others are within the central portion. Without the benefit of the present invention, only periphery cells could be connected to the cathode by short, uniform length wirebonds.

As an example, for an MCT chip 0.750"×0.750", aluminum wirebonds with a reliability limit of 0.200 inches would be too short to conduct high current from centrally located anode cells to a surface surrounding the chip. In accordance with the present invention, wirebonding grid 34 is configured so that a portion of it is within 0.200 inches of each anode cell 26. Thus, short, uniform length wirebonds 40 connect each anode cell 26 to wirebonding grid 34. This insures that wirebond length is within the optimal wire reliability limit and minimizes the voltage drop along wirebonds 40. In addition, uniform length wirebonds provide for similar amounts of current to be carried by each, minimizing the possibility of the domino effect failure of the wirebonds.

The semiconductor package of the present invention permits high thermal dissipation and high current conductance. Thermal dissipation occurs by both radiation and conductance. Radiation takes place through cover 38 and frame assembly 28, while thermal conductance occurs through substrate 12.

In addition, the present invention allows high current conductance. High cathode current from the bottom of semiconductor chip 24 conducts consecutively through the solder attachment of the chip, the copper mounting pad 18, the copper vias 22, the copper foil layer 16, and then to an outside connection.

High anode current from the anode cells 26 of chip 24 conducts consecutively through the parallel wirebonds 40 and wirebonding grid 34 to frame assembly 28, where a high current connection can be made.

It will be apparent to those skilled in the art that various modifications and variations can be made in the semiconductor package of the present invention without departing from the spirit and scope of the invention. Thus, it is intended that the present invention cover the modifications and variations of the invention provided they come within the scope of the appended claims and their equivalents.

We claim:

1. A semiconductor package, comprising:

a substrate having a ceramic core with first and second opposite planar surfaces, a copper foil layer bonded to the second planar surface, a copper inner mounting pad on the first planar surface for conductively supporting a semiconductor chip having multiple electrodes, a copper outer ring on the first planar surface surrounding and electrically isolated from the inner mounting pad, and a plurality of spaced copper vias extending through the ceramic core electrically connecting the mounting pad to the copper foil layer; and a metallic frame assembly having a central chamber formed by sidewalls of a predetermined height mounted on the outer ring of the first planar surface of said substrate, a pair of terminals extending through the sidewalls of the chamber, and a wirebonding grid spanning the central chamber and having an electrical isolation layer bonded to a surface of the wirebonding grid opposing and spaced from the substrate, said wirebonding grid having a plurality of passages spaced from the sidewalls and from each other for receiving metallic wirebonds connected at one end to the wirebonding grid and at an opposite end to the multiple electrodes of the chip mounted on the inner mounting pad, said inner mounting pad and grid being spaced one above the other with the grid and passages configured to permit connection of wirebonds of optimal equal length to each such electrode.

2. The package of claim 1, wherein the ceramic core is composed of one of the group consisting of aluminum nitride and beryllium oxide.

3. The package of claim 1, wherein the electrical isolation layer of the metallic frame assembly is composed of one of the group consisting of aluminum oxide and epoxy.

4. The package of claim 1, wherein the terminals are composed of ceramic sealed copper.

5. The package of claim 1, wherein the metallic frame assembly is composed of one of the group consisting of copper and copper alloys with high copper content.

6. A semiconductor package, comprising:

a substrate having a ceramic core with first and second opposite planar surfaces, a copper foil layer bonded to the second planar surface, a copper inner mounting pad on the first planar surface, a copper outer ring on the first planar surface surrounding and electrically isolated from the inner mounting pad, and a plurality of spaced copper vias extending through the ceramic core electrically connecting the mounting pad to the copper foil layer; and a metallic frame assembly having a central chamber formed by sidewalls of a predetermined height mounted on the outer ring of the first planar surface of said substrate, a pair of terminals extending through the sidewalls of the chamber;

a wirebonding grid spanning the central chamber and having an electrical isolation layer bonded to a surface of the wirebonding grid opposing and spaced from the substrate, a semiconductor chip with a plurality of spaced electrodes positioned beneath the wirebonding grid in the space between the electrical isolation layer and the inner mounting pad, said grid configured to have a portion overlapping and spaced from each electrode a distance less than a distance required to connect a plurality of wirebonds of optimal equal length to each such electrode; and a plurality of metallic wirebonds of approximately equal optimum length connecting the electrodes to the wirebonding grid.

7. A semiconductor package, comprising:

a substrate having a planar surface, a copper mounting pad covering the planar surface for conductively supporting a semiconductor chip having multiple electrodes, a copper outer ring on the planar surface surrounding and electrically isolated from the mounting pad;

a metallic frame assembly having a central chamber mounted on the outer ring of said substrate;

a wirebonding grid spanning the central chamber and having an electrical isolation layer bonded to a surface of the wirebonding grid opposing and spaced from the substrate, said wirebonding grid having a plurality of passages spaced from the sidewalls and from each other;

a semiconductor chip with a plurality of spaced electrodes mounted to the the mounting pad beneath and spaced from the wirebonding grid; and multiple wire bonds of equal and optimum length extending through the plurality of passages and connected at one end to the wirebonding grid and at an opposite end to the multiple electrodes of the chip.

8. The package of claim 7 wherein the substrate comprises a copper foil layer bonded to a surface opposite the copper mounting pad, and a plurality of spaced copper vias connecting the mounting pad to the copper foil layer.

9. The package of claim 6, wherein the semiconductor chip is one of the group consisting of a thyristor, a metal oxide semiconductor field-effect transistor, and an insulated gate drive bipolar transistor.

10. The package of claim 6, wherein the semiconductor chip is a substrate MOS Controlled Thyristor.

11. The package of claim 6, wherein each metallic wirebond is composed of aluminum having substantially equal diameters in the range of approximately 0.01 to 0.02 inches.

12. The package of claim 6 further comprising a metallic cover bonded to the sidewalls of the central chamber for hermetically sealing the chamber.

13. A semiconductor package, comprising:

a substrate having a ceramic core composed of one of the group consisting of aluminum nitride and beryllium oxide with first and second opposite planar surfaces and a thickness of approximately 0.04 inches, a copper foil layer bonded to the second planar surface, a copper inner mounting pad on the first planar surface, a copper outer ring on the first planar surface surrounding and electrically isolated from the inner mounting pad, said copper foil layer, inner mounting pad, and outer ring having thicknesses of approximately 0.01 inches, and a plurality of spaced copper vias extending through the ceramic core electrically connecting the mounting pad to the copper foil layer;

a substrate MOS Controlled Thyristor with a plurality of spaced anode cells mounted on the mounting pad;

a plurality of aluminum wirebonds of approximately equal length and having substantially equal diameters in the range of approximately 0.01 to 0.02 inches;

a copper frame assembly having a central chamber formed by sidewalls of a predetermined height mounted on the outer ring of the first planar surface of said substrate, a pair of terminals composed of ceramic sealed copper extending through the sidewalls of the chamber, and a wirebonding grid spanning the central chamber and positioned approximately 0.05 inches apart from the substrate and having an electrical isolation layer composed of one of the group consisting of aluminum oxide and epoxy bonded to a surface of the wirebonding grid opposing and spaced from the substrate, said wirebonding grid for connecting the aluminum wirebonds to the anode cells of the MOS Controlled Thyristor; and a copper cover bonded to the sidewalls of the central chamber for hermetically sealing the chamber.

* * * * *